United States Patent [19]
Johnson

[11] Patent Number: 5,003,507
[45] Date of Patent: Mar. 26, 1991

[54] EPROM EMULATOR FOR SELECTIVELY SIMULATING A VARIETY OF DIFFERENT PAGING EPROMS IN A TEST CIRCUIT

[76] Inventor: Simon Johnson, 17930 151 Way NE., Woodinville, Wash. 98072

[21] Appl. No.: 241,385

[22] Filed: Sep. 6, 1988

[51] Int. Cl.[5] .................. G11C 7/00; G11C 29/00
[52] U.S. Cl. .................. 364/900; 365/201; 365/238.5; 371/21.1; 364/578; 364/933.8; 364/927.81; 364/965.76; 364/965
[58] Field of Search .............. 365/201, 221, 235, 244, 365/189.03, 189.08, 189.01, 238.5; 371/10.1, 21.1, 21.2; 364/200 MS File, 5900 MS File, 578

[56] References Cited

U.S. PATENT DOCUMENTS

| | | | |
|---|---|---|---|
| 4,319,341 | 3/1982 | Fukushima | 365/94 |
| 4,363,109 | 12/1982 | Gardner | 365/94 |
| 4,368,515 | 1/1983 | Nielsen | 364/200 |
| 4,441,167 | 4/1984 | Principi | 365/94 |
| 4,451,903 | 5/1984 | Jordan | 365/94 |
| 4,485,457 | 11/1984 | Balaska et al. | 364/900 |
| 4,578,751 | 3/1986 | Ervin | 364/200 |
| 4,654,829 | 3/1987 | Jiang et al. | 365/189.03 |
| 4,698,790 | 10/1987 | Davis | 365/189.03 |
| 4,725,983 | 2/1988 | Terada | 365/185 |

FOREIGN PATENT DOCUMENTS 0175102 3/1986 European Pat. Off. .......... 365/235

OTHER PUBLICATIONS

Ball, Stuart R., "Build The Emulo-8", *Byte*, Apr. 1986, pp. 105-110.
Page Addressing Expands Addressable Memory in Up Systems, EDN, Apr. 30, 1987, pp. 189-197.

*Primary Examiner*—Eddie P. Chan
*Assistant Examiner*—Kevin A. Kriess
*Attorney, Agent, or Firm*—Jerry T. Kearns

[57] ABSTRACT

An EPROM emulator makes use of a simple device with a housing connected to a eprom header which serves to connect the device to a circuit board in conjunction with a microprocessor emulator. Inside the housing are paging and data select circuits and a set of SRAM which are used in place of a traditional EPROM to hold the programming information. To program the device, the EPROM simulator is connected to the circuit board in place of an eprom. A switch on the housing is then turned to place the device in programming mode. The same switch also determines how the device is programmed by accessing the appropriate data lines for the number of pages of EPROM memory which are being emulated. After the switch is properly selected, the emulator is programmed by sending the data through the eprom socket on the circuit board via the microprocessor emulator. After the device is programmed, the switch on the housing is turned to place the device in read-only mode so that it can simulate an EPROM. In addition to the external switch, there are internal jumpers which are set to determine the type of EPROM which is to be emulated.

1 Claim, 3 Drawing Sheets

EPROM EMULATOR FOR SELECTIVELY SIMULATING A VARIETY OF DIFFERENT PAGING EPROMS IN A TEST CIRCUIT

BACKGROUND OF THE INVENTION

1. Field of the Invention

The present invention relates to eprom emulators, and more particularly pertains to the field of paging eproms and their emulation for the purpose of developing hardware and software in an expeditious manner. The use of paging EPROMs allows the EPROM to act as many individual ROMs because different sets of instructions can accessed by use of a paging circuit. This allows the EPROM to be much more versatile. This also makes the programming more difficult and time consuming. Therefore, there is a need to eliminate this time consuming reprogramming during the development stages of this type of hardware. The present invention allows the programming to be changed virtually instantaneously. This allows the programmers to concentrate on the programming without the worry of having to face a long reburning process for a new test. This in turn leads to a better product since it can be more thoroughly tested before the final EPROM is programmed and any bugs or faults which are found can be eliminated by further testing.

2. Description of the Prior Art

Various types of eprom emulators are known in the prior art. A typical example of such an eprom programmer or emulator is to be found in U.S. Pat. No. 4,578,751, which issued to Edward Erwin on Mar. 25, 1986. This patent discloses the use of a device which is capable of simultaneously programming a large number of EPROMS. U.S. Pat. No. 4,451,903, which issued to Larry Jordan on May 29, 1984 discloses a method of permanently programming an EPROM. U.S. Pat. No. 4,441,167, which issued to Fabio Principi on Apr. 3, 1984, discloses an EPROM which can be programmed by changing the resistance characteristics of the device. U.S. Pat. No. 4,363,109 which issued to Raymond Gardner on Dec. 7, 1982, discloses a method of constructing an EPROM. U.S. Pat. No. 4,319,341, which issued to Toshitaka Fukushima et al on Mar. 9, 1982, discloses a circuit for programming an EPROM.

While the above mentioned devices are suited for their intended usage, none of these devices show the use of static RAM to actively mimic an eprom for the purpose of testing circuitry and software. The prior art devices need to be extensively and time consumingly programmed. The present invention is capable of being programmed quickly by simply throwing a switch and sending the new information to SRAM. This enables reprogramming as often as necessary without the extended programming time needed by traditional EPROM's. This device is especially useful in the field of software development. When placed in the target system with a microprocessor emulation tool, the EPROM emulator can be reprogrammed by simply writing data to its assigned address space. This allows the emulator to be changed as often as necessary and results in a better product. Inasmuch as the art is relatively crowded with respect to these various types of eprom programmers and emulators, it can be appreciated that there is a continuing need for and interest in improvements to such eprom emulators, and in this respect, the present invention addresses this need and interest.

SUMMARY OF THE INVENTION

In view of the foregoing disadvantages inherent in the known types of eprom emulators now present in the prior art, the present invention provides an improved eprom emulator. As such, the general purpose of the present invention, which will be described subsequently in greater detail, is to provide a new and improved eprom emulator which has all the advantages of the prior art eprom emulators and none of the disadvantages.

To attain this, a representative embodiment of the concepts of the present invention is illustrated in the drawings and makes use of a simple device with a housing which is connected to a header which serves to connect the device to the circuit board of a microprocessor emulator based target system. The microprocessor emulator has the necessary circuitry to be programmed by the downloading of object code. This downloading process can now include the reprogramming of the EPROM by use of the EPROM simulator of the present invention. Paging and data select circuits and a set of SRAM which are used in place of a traditional EPROM to hold the programming information are located within the housing. To program the device, the EPROM simulator is placed on the circuit board in place of an eprom. A switch on the housing is then turned to place the device in programming mode. The same switch also determines how the device is programmed by connecting the appropriate data lines for a particular page of EPROM memory which is being emulated. After the switch is properly selected, the emulator is programmed by sending the data through the eprom socket on the circuit board. This can only occur when the write signal from the test probe which is connected to the read/write signal of the target board is present. After the device is programmed, the switch on the housing is turned to place the device in read-only mode so that it can simulate an EPROM. In addition to the external switch, there are internal jumpers which are set to determine the type of EPROM which is to be emulated.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved eprom emulator which has all the advantages of the prior art eprom emulators and none of the disadvantages.

It is another object of the present invention to provide a new and improved eprom emulator which may be easily and efficiently manufactured and marketed.

It is a further object of the present invention to provide a new and improved eprom emulator which is of a durable and reliable construction.

An even further object of the present invention is to provide a new and improved eprom emulator which is susceptible of a low cost of manufacture with regard to both materials and labor, and which accordingly is then susceptible of low prices of sale to the consuming public, thereby making such eprom emulators economically available to the buying public.

Still yet another object of the present invention is to provide a new and improved eprom emulator which provides in the apparatuses and methods of the prior art some of the advantages thereof, while simultaneously overcoming some of the disadvantages normally associated therewith.

Still another object of the present invention is to provide a new and improved eprom emulator which can be easily reprogrammed and placed in a circuit so that the circuit my be tested as often as necessary without the delays for reprogramming that occur with regular EPROMS.

Yet another object of the present invention is to provide a new and improved eprom emulator which has the ability to emulate not only regular EPROMS but also paging EPROMS.

Even still another object of the present invention is to provide a new and improved eprom emulator which can emulate a wide variety of paging EPROMS thus making it more suited for use in testing since it could be removed from one setup, reset to emulate a different EPROM and reused as often as necessary without the need for a separate emulator for each type of paging EPROM.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
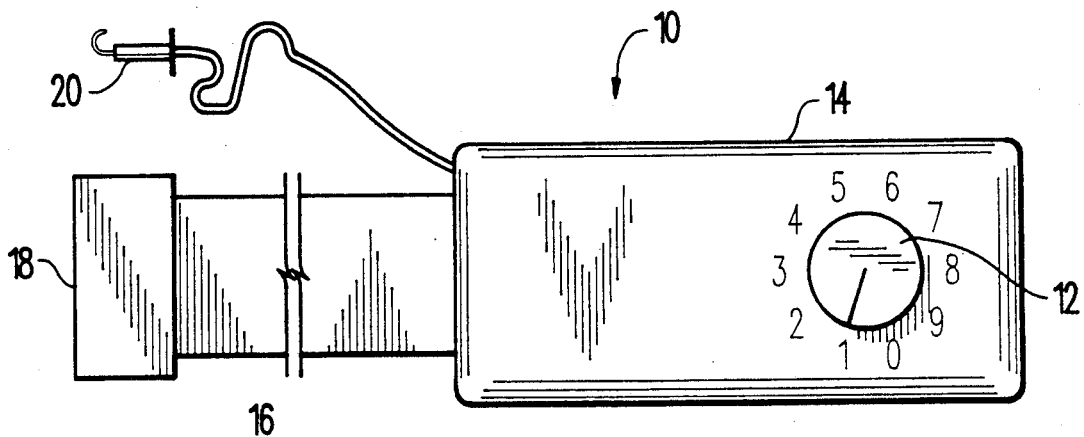
FIG. 1 is a perspective view of the EPROM emulator of the present invention, illustrating the test lead, programming switch, ribbon cable and pin connector.

With reference now to the drawings, and in particular to FIG. 1 thereof, a new and improved eprom emulator embodying the principles and concepts of the present invention and generally designated by the reference numeral 10 will be described.

More specifically, it will be noted that the first embodiment 10 of the invention includes a housing 14 which contains the circuitry and SRAMS for the device. A switch 12 on the housing 14 is used to select the programming mode and to deselect the programming mode. A ribbon cable 16 extending from the housing 14 is connected to a twenty-eight pin header 18 which is plugged into the circuit in place of the EPROM to be emulated. Also connected to the housing 14 is a test clip 20 which sends the read/write signal to the device to allow it to be programmed if the switch 12 is already set to the correct position.

Figure 2:
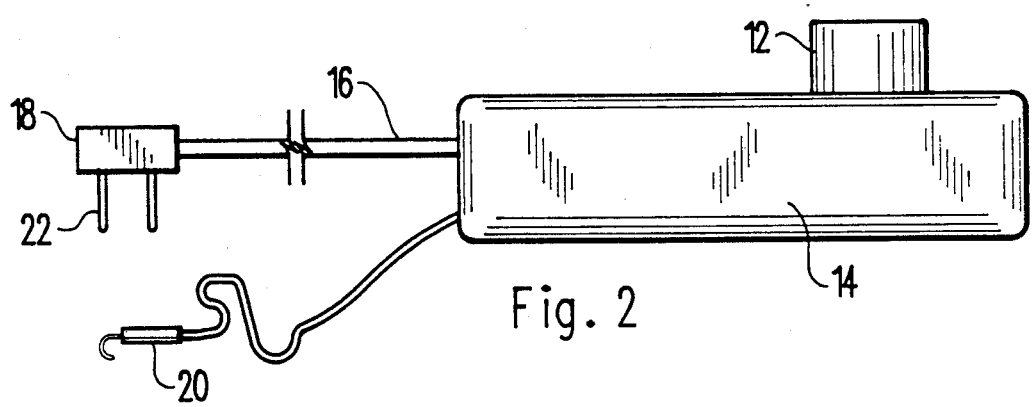
FIG. 2 is a side view of the device as shown in FIG. 1.

In FIG. 2, a side view of the present invention is illustrated. In this view the pins 22 which descend from the lower surface of the header 18 are illustrated. These pins 22 are received in the EPROM socket on the circuit board and serve to interface the emulator of the present invention with the circuit board which is being tested or programmed.

Figure 3:
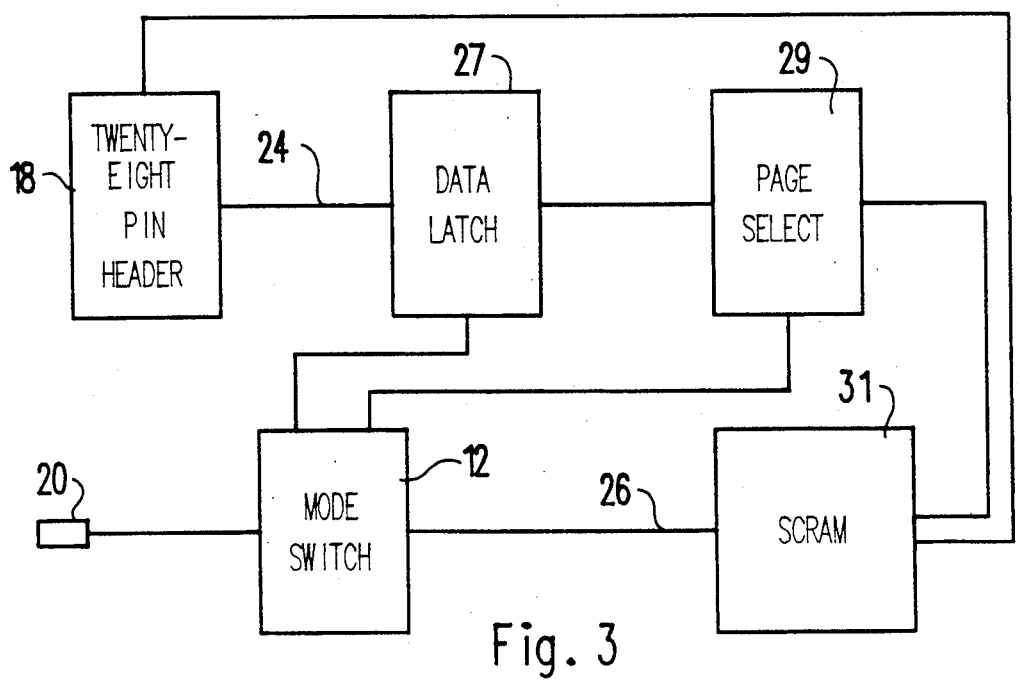
FIG. 3 is a block diagram showing the elements of the invention. The EPROM socket connector, the data select circuit, the page select circuit, the switch and the DRAM, are illustrated.

FIG. 3 is a block diagram which shows the general elements of the invention. The twenty-eight pin header 18 serves to connect the emulator to the circuit board. The data latch circuitry 27 handles the paging input to the EPROM. The page select circuitry 29 controls the signals sent to the SRAMS and determines which page of the simulated EPROM is currently active. The address bus 24 handles the actual data flow between elements of the emulator. SRAM 31 holds the data or programming and actually simulates the desired EPROM. The read write line 26 determines the status of the SRAM.

Figure 4:
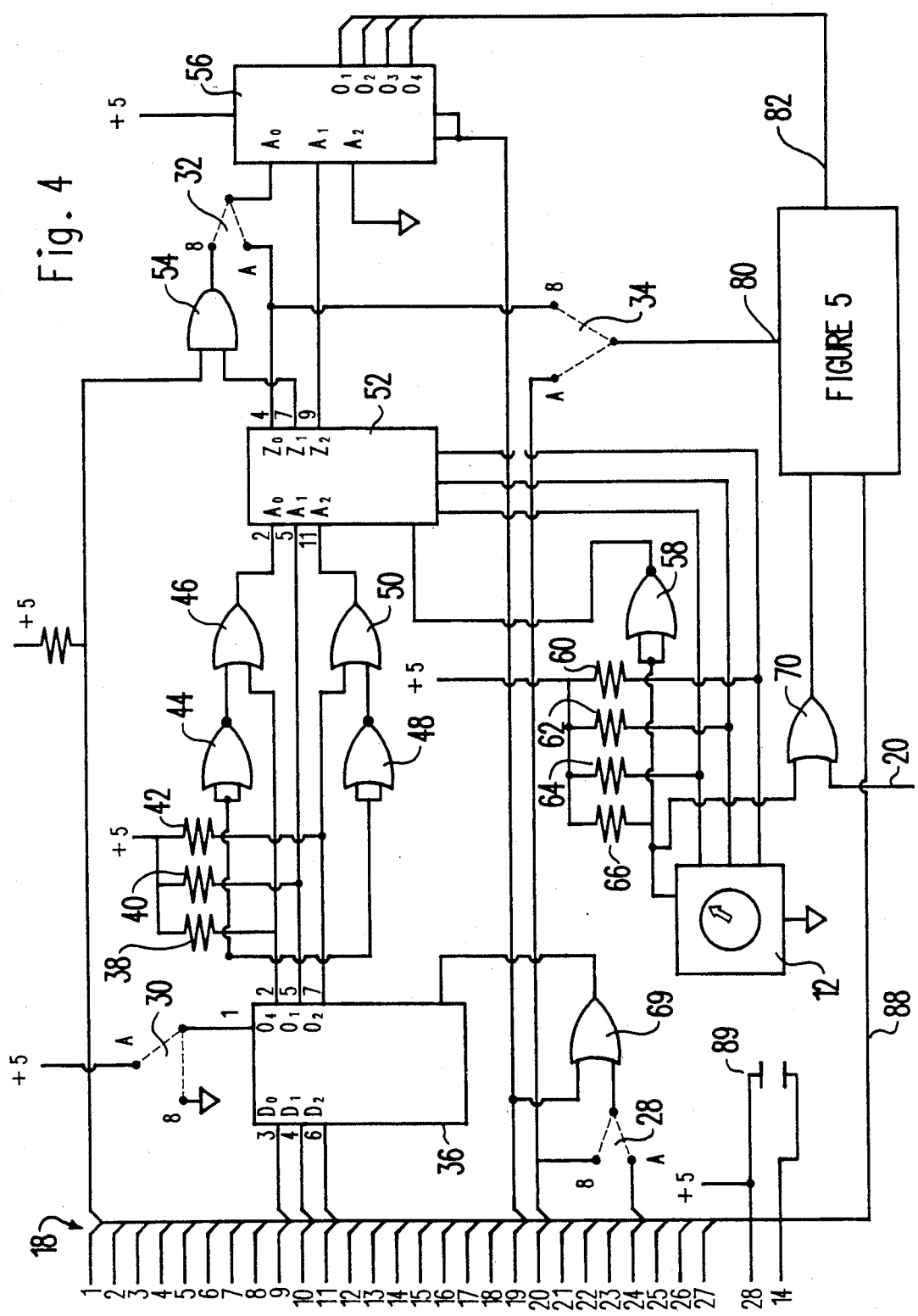
FIG. 4 is a circuit diagram of the data select and page select circuits and their interface with the SRAM and the test probe.

FIG. 4 is a schematic diagram of the circuitry of the present invention. The basic circuit was outlined in FIG. 3 and includes more particularly, the following elements. The 28 pin header 18 connects the present invention to the target board to be tested. Elements 44, 46, 69, 89, 48, 50, 36, 38, 40, 42, 52, 54, 56 and 29 control the data latching and page select features of the emulator. These are of standard design and are well known the those of skill in the art. The switch 12 controls the emulator programming mode. When it is set in the read/write mode, the write signal from the target system is allowed access to the SRAMS. When this signal is present, it causes the data in the bus to be written to the page for which the switch is set. This enables each page of a multi-page EPROM emulation to be loaded in turn. When the programming write signal is not present and the switch 12 is in read only mode, a write signal on the data bus will activate the paging circuitry of the EPROM. This occurs because EPROMs ignore anything in the data bus during write operations. This allows the write signal to be used to activate a page selection circuit which causes the EPROM to switch to a different page, In read only mode the paging features of the emulator of the present invention function in a manner consistent with that of ordinary EPROMs. The actual control of the device through switch 12 requires the use of resistors 60,62,64,66 and gates 58 and 70. These serve to send the data to the correct page of EPROM memory. In addition to switch 12, there are jumpers 28,30,32 and 34. These jumpers are set according to a chart, and determine which of 8 types of EPROM is to be emulated. The device is capable of emulating the following EPROMS by setting the jumpers as shown.

|            |                    | JUMPERS |    |    |    |
|------------|--------------------|---------|----|----|----|
| EPROM TYPE | MEMORY SIZE        | 28      | 30 | 32 | 34 |
| 2764       | 8k × 8             | A       | A  | A  | B  |
| 27128      | 16k × 8            | A       | A  | A  | B  |
| 27256      | 32k × 8            | A       | A  | A  | A  |
| 27512      | 64k × 8            | A       | A  | B  | A  |
| 27513      | 4 pg × (16k × 8)   | B       | B  | B  | B  |
| 27515      | 2 pg × (32k × 8)   | A       | B  | A  | A  |
| 27011      | 8 pg × (16k × 8)   | B       | B  | B  | B  |
| 27012      | 4 pg × (31k × 8)   | A       | B  | A  | A  |

When each of the jumpers is properly set, the data will be stored on the correct pages during the writing operations. The use of these jumpers to allow multiple emulations make the emulator much more versatile. Lines 80, 82, 84 and 88 connect to the SRAM and control the writing, addressing and data latching functions in the same way as in ordinary EPROMS.

Figure 5:
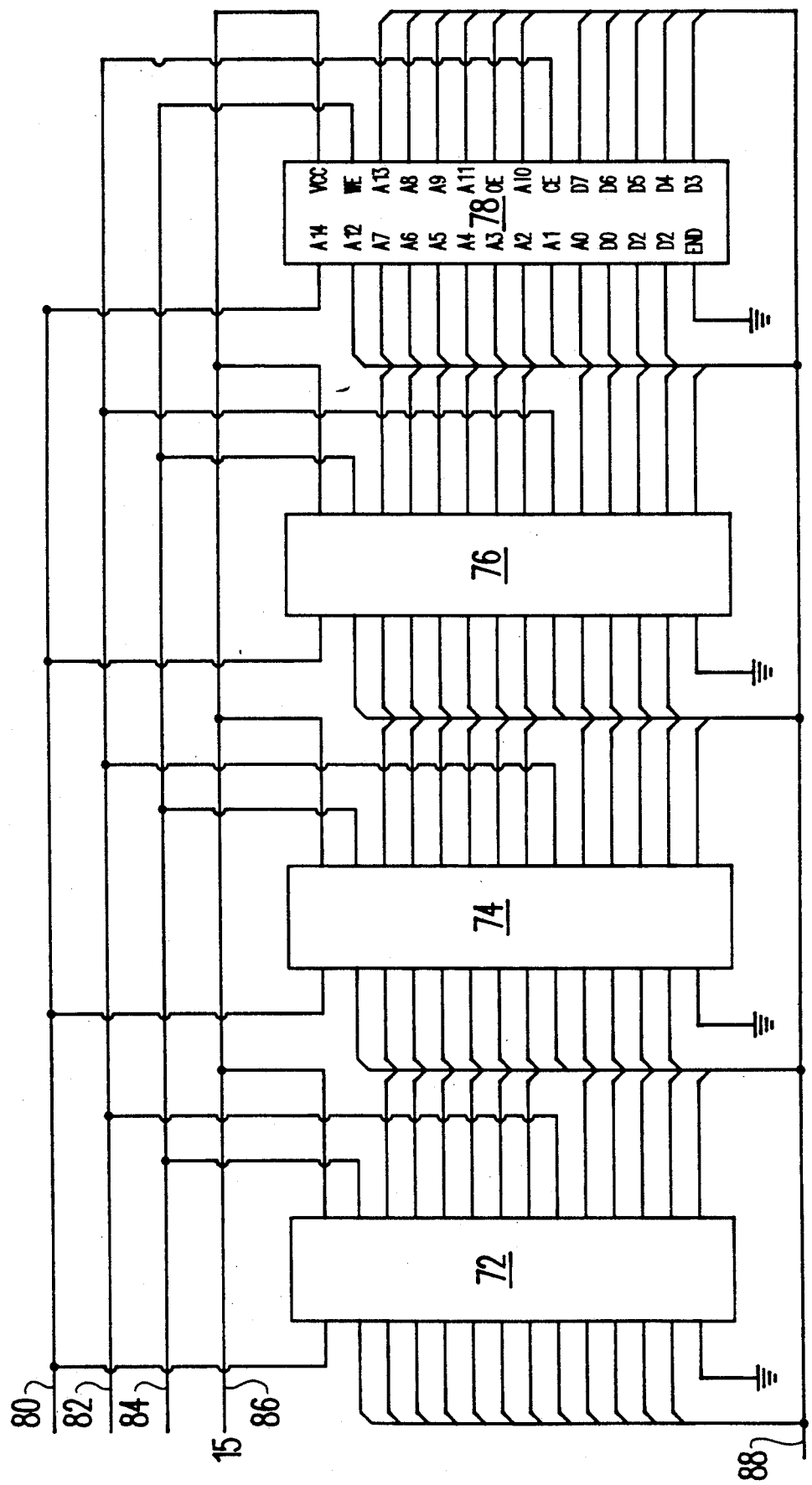
FIG. 5 is a circuit diagram showing the connections to the SRAM which are used to store the programming information in order to simulate an EPROM.

FIG. 5 illustrates the actual SRAMs which hold the data, in the same way as ordinary EPROMS, once they are programmed. The only difference is that they need a power line to hold the memory unlike EPROMS which store data whether power is present or not. The interface between the SRAMs and the data latch, page select and writing circuits is provided through lines 80, 82, 84 and 88 which provide signals to page or write to the data buffers. These SRAMs are also connected to the data bus to transfer the information as programmed.

As may be understood from the above description, the eprom emulator of the present invention is a parasitic module that plugs directly into a target circuit and responds exactly as a conventional EPROM would. The advantage of the emulator of the present invention over a normal development system overlay is that it allows page swapping for ROM pages that are all mapped to the same address. The emulator is designed for use with any microprocessor emulator with I/O translators.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by LETTERS PATENT of the United States is as follows:

1. An eprom emulator for simulating a paging EPROM in a test circuit, comprising:
    a pin header for connecting the emulator to an EPROM socket on a test circuit board;
    a cable connecting the pin header to a circuit housing;
    a data select circuit contained in the circuit housing;
    a set of SRAM in said circuit housing for simulating an EPROM;
    jumper means operatively connected to said SRAM set for selectively configuring said SRAM set as a variety of different EPROMs;
    a write circuit in said housing for storing data in said SRAM set in a manner simulating an EPROM;
    a paging circuit contained in the circuit housing for paging the simulated EPROM;
    a test probe for connection to a read/write circuit on the test circuit board in order to receive a read/write signal and activate said writing circuit in said housing;
    a switch operably connected for setting said SRAM set in write mode or read only mode, said switch also operative to select which page of a multi-page simulated EPROM is being written to when said write circuit is activated.

* * * * *